United States Patent [19]

O'Neil

[11] Patent Number: 4,469,777

[45] Date of Patent: Sep. 4, 1984

[54] SINGLE EXPOSURE PROCESS FOR PREPARING PRINTED CIRCUITS

[75] Inventor: James W. O'Neil, Howell, N.J.

[73] Assignee: E. I. Du Pont de Nemours and Company, Wilmington, Del.

[21] Appl. No.: 556,877

[22] Filed: Dec. 1, 1983

[51] Int. Cl.³ .................. B05D 5/12; H05K 3/00; B44C 1/22; C03C 15/00

[52] U.S. Cl. .................... 430/315; 29/846; 29/874; 156/630; 156/644; 156/655; 156/659.1; 156/902; 427/96; 427/98; 430/313

[58] Field of Search .............. 427/96, 97, 98; 430/313, 315, 329; 29/829, 846, 852, 874; 156/644, 655, 659.1, 668, 902, 630; 174/68.5

[56] References Cited

U.S. PATENT DOCUMENTS 3,350,498 10/1967 Leeds .................................. 174/68.5
3,436,468 4/1969 Haberecht ........................ 174/68.5
3,965,277 6/1976 Guditz et al. ..................... 427/98 X
4,413,051 11/1983 Thomas ............................. 430/312

Primary Examiner—William A. Powell

[57] ABSTRACT

A process for preparing a two layer printed circuit having conductive interconnections wherein at least one layer of a photoadhesive composition is applied to a substrate bearing an electrically conductive circuit pattern and exposing said photoadhesive layer or layers through a circuit image of three different optical densities, i.e., zero, gray and opaque, removing portions of the photosensitive layer by solvent washout, applying finely divided metal, alloy or plating catalyst to adherent image areas, optionally curing the printed circuit, e.g., heating or ultraviolet exposure and plating to form an interconnected electrically conductive circuit pattern. Multilayer printed circuits can also be prepared by repeating the steps using additional layers of photoadhesive material.

11 Claims, 5 Drawing Figures

SINGLE EXPOSURE PROCESS FOR PREPARING PRINTED CIRCUITS

DESCRIPTION

1. Technical Field

This invention relates to a process for preparing a printed circuit, particularly a printed circuit having at least two layers. More particularly this invention relates to a process for preparing a multilayer printed circuit having conductive interconnections between layers by using a single exposure for each circuit layer.

2. Background Art

Many methods are known for the preparation of multilayer printed circuits. In many older techniques conductive holes are introduced through printed circuit boards to accommodate insertion and soldering of electrical component leads and for making electrical connections between two or more circuit patterns. Holes are conventionally drilled or punched through a copper clad, rigid board followed by a plating procedure, e.g., a copper reduction procedure such as that disclosed in "Printed Circuits Handbook" edited by Clyde F. Coombs, Jr., published by McGraw-Hill Book Company, New York, N.Y., 1967, Chapter 5. The copper clad board with plated through-holes can then be processed into printed circuit boards using resists and processes disclosed in "Printed Circuits Handbook", supra, or in Celeste U.S. Pat. No. 3,469,982. A disadvantage of the conventional copper reduction procedure for plating holes is a waste of expensive catalyst which adheres not only to the hole walls but to the copper cladding, resulting in superfluous overplating of the copper cladding.

The preparation of multilayered printed circuit boards using a photohardenable film and additive plating process is described in Peiffer U.S. Pat. Nos. 4,054,479 and 4,054,483. The conductive interconnections between the layers are produced by predrilling holes in a photosensitive element and registering the holes with underlying printed circuit patterns. Such predrilling procedures by their inherent inaccuracies of registration are limited to printed circuit patterns where circuit lines are not closely spaced.

Peiffer U.S. Pat. No. 4,157,407 describes a process for preparing printed circuits with electrical interconnections without drilling or punching the requisite hole and without using the time consuming hole chemical catalyzation process of the prior art. Multilayered circuits can be provided by this process which have high packing density with multiple crossovers and interconnections or vias. The process of U.S. Pat. No. 4,157,407, while effective for the preparation of multilayered circuits, requires many repetitive steps in practical use including: two registrations of the image and exposure to actinic radiation; two applications of finely divided metal, including application to the through-holes; two applications of heat; and two removals of excess metal particles, e.g., by water-wash followed by drying.

It is therefore desirable to provide a process for the preparation of printed circuits having at least two circuit layers interconnected by vias by a simplified method which eliminates the need of any process repetition in the preparation of any single conductive layer.

BRIEF DESCRIPTION OF DRAWING

In the accompanying drawing forming a material part of this disclosure

DISCLOSURE OF THE INVENTION

Figure 1A:
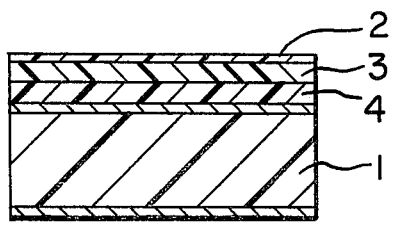
FIGS. 1A, 1B, 1C, 1D, and 1E are cross sections of a simple two-layer printed circuit at various stages of fabrication in accordance with the invention.

In accordance with this invention there is provided a process for preparing a two layer printed circuit board having conductive interconnections which comprises:

(a) applying to a substrate bearing an electrically conductive circuit or circuit pattern at least one layer of a photoadhesive composition;

(b) exposing the layer or layers to actinic radiation through a circuit image consisting essentially of areas of three different optical densities (1) optical density about 0.0 which transmits substantially all the actinic radiation; (2) optical density at least about 2.5 which transmits substantially no actinic radiation; and (3) optical density intermediate between values of (1) and (2) which transmits partial actinic radiation;

(c) removing the areas corresponding to image areas (2) in step (b) with a solvent for the photoadhesive composition to form vias with sidewalls, image areas (1) and (3) of step (b) being nonremovable with said solvent;

(d) optionally tackifying image areas corresponding to (3) of step (b);

(e) applying finely divided metal, alloy or plating catalyst to adherent image areas corresponding to (3) in step (b) and sidewalls formed in step (c);

(f) optionally removing excess toner from image areas corresponding to (1) of step (b);

(g) optionally curing the circuit board by heating the board at a temperature up to at least 100° C.; and/or exposing the circuit board to ultraviolet radiation; and (h) plating and metallized or catalyzed image to form an electrically conductive circuit pattern interconnected with the underlying circuit or circuit pattern.

The process of the invention for preparing printed circuits of at least two circuits having electrical connections therebetween has at least the following steps:

(a) applying to a substrate bearing an electrically conductive pattern at least one layer of a photoadhesive composition, preferably at least two layers of photoadhesive composition which differ in composition and which will be described more fully below;

(b) exposing the layer or layers to actinic radiation through a circuit image consisting essentially of areas of three different optical densities (1) being about 0.0, (2) being at least 2.5 and (3) intermediate between (1) and (2) described more fully below;

(c) removing the areas corresponding to image areas (2) of step (b) with a solvent for the photoadhesive composition to form via holes; the other areas being nonremovable with the solvent;

(e) applying finely divided metal, alloy or plating catalyst to adherent image areas corresponding to (3) in step (b); and (h) plating the metallized or catalyzed image to form an electrically conductive circuit pattern interconnected with the underlying circuit.

In addition to the above required steps, the following optical steps can be used: after step (c) described above (d) tackifying image areas corresponding to (3) of step (b). The tackifying is generally accomplished by heating the layer to a temperature above the tack point of the less exposed areas of the layer but below the tack point of the fully exposed areas of the layer, i.e., generally between 70° to 160° C. The tackifying temperature is dependent on the particular photoadhesive compositions used. The tackifying step can occur prior to or simultaneously with step (e); after step (e) removing excess metal, alloy or catalyst from image areas corresponding to (1) of step (b), i.e., wash off residual material and dry; after step (e) or concurrently therewith step (g) curing the circuit board by heating the board at a temperature up to at least 100° C., and/or exposing the circuit board to ultraviolet radiation.

A multilayer printed circuit board having conductive interconnections can be prepared from a two layer printed circuit which has been prepared utilizing steps (a), (b), (c), (e) and (h) as described above and any or all of optional steps (d), (f) and (g) and then repeating the required steps as well as any of the optional steps at least once using the newly plated circuit pattern in step (h) for the succeeding process step (a).

The printed circuit substrate employed in the present invention can be any one of the various kinds of sheets, plates, synthetic resin plates, synthetic resin laminated plates, or composites, etc., having the necessary electrical and mechanical properties, chemical resistance, heat resistance, etc. Examples of resins include: phenol-formaldehyde, epoxy and melamine resins, etc. Glass plates and ceramic or ceramic coated metal plates are also useful. The substrate can also be a paper, cardboard, fiber, including glass cloth, wooden sheet material or paper base phenolic resin laminate. Paper base without resin is particularly useful in producing low-cost printed circuits. Metal sheets can be used provided that the material adhered thereto acts as an insulating barrier between the metal sheet support and the buildup metallized circuit. Also useful are self-supported photohardenable elements as disclosed in Peiffer U.S. Pat. No. 4,054,479. The printed circuit substrate can have on its surface a conductive metal layer, e.g., copper, which is often referred to as a ground plane. A printed circuit pattern which can contain closely spaced lines can be present on the printed circuit substrate. The printed circuit pattern can be prepared by standard methods known in the art, e.g., etching of copper on the surface of the substrate or by other methods such as those described in Peiffer U.S. Pat. No. 4,234,626 and Haney and Lott U.S. Pat. No. 4,411,980.

To form printed circuit boards with conductive interconnections according to the invention at least one layer of an adherent, e.g., tacky photoadhesive composition, is applied to the printed circuit surface. The photoadhesive composition can be applied in liquid, e.g., solution, suspension, etc., by conventional means, e.g., dip coating, spin coating, coating with a doctor knife, spraying, etc. Preferably, the photoadhesive composition is applied in the form of a dry layer using a lamination procedure. A single layer of photoadhesive composition may be at least 0.0005 inch (0.013 mm) in thickness, preferably range in thickness from 0.002 to 0.004 inch (0.051 to 0.102 mm). Preferably a photoadhesive element containing two layers of photoadhesive composition is used. The individual layers range in thickness from 0.0001 to 0.005 inch (0.0025 to 0.127 mm) for the upper layer and 0.0001 to 0.005 inch (0.0025 to 0.127 mm) for the lower layer adhered to the printed circuit board. Preferably the upper layer has a thickness which is about 10 percent the thickness of the lower layer, and the combined thickness of the two layers preferably is between about 0.002 to 0.004 inch (0.051 to 0.102 mm). The photoadhesive layer has adhered thereto with low to moderate adherence a thin, flexible, polymeric film support which transmits radiation actinic to the photoadhesive layer. Suitable supports include: polyethylene terephthalate, polyimides, polyolefines, e.g., polypropylene, polyparabanic acid, etc. The opposite side of the photoadhesive layer that is to be applied to the surface of the circuit board can have adhered thereto a protective cover sheet with less adherence to said layer than adherence between the above-described support and the photoadherent layer.

The photoadhesive compositions used in the process of this invention can be used in a double photoadherent layer embodiment and a single photoadherent layer embodiment. The photoadherent compositions are prepared typically containing a mixture of two polymeric binders, at least one, preferably two, monomeric compounds, photoinitiator or photoinitiator system, and optionally inhibitors, dyes, pigments, and plasticizers. Suitable compounds or materials of the above-mentioned types are disclosed in Haney and Lott U.S. Pat. No. 4,411,980, column 3, line 57 to column 6, line 26, the disclosure of which is incorporated by reference. Optical brighteners, fillers and elastomeric compounds are other optional additives in the photoadherent composition. Optical brighteners which can be present in the photoadherent compositions are disclosed in Held U.S. Pat. No. 3,854,950, column 2, line 67 to column 3, line 41 and column 4, lines 25 to 42, the disclosures of which are incorporated by reference. Fillers which can be present in the photoadherent compositions are disclosed in Celeste and Bauer U.S. Pat. No. 3,261,686, column 4, lines 43 to 52, and Cohen and Lazaridis, U.S. Pat. No. 4,414,278 the disclosures of which are incorporated by reference. Elastomeric compounds are for example the Hycar® rubbers, a product of Goodyear Co., Akron, Ohio. The binders with any incorporated fillers are present in 30 to 80 parts by weight, preferably 40 to 50 parts by weight; the monomers are present in 20 to 65 parts by weight, preferably 35 to 60 parts by weight; the initiator system is present in 1 to 10 parts by weight, preferably 3 to 6 parts by weight, all based on the total weight of the composition.

Contrast is important for the layer of photoadherent composition since some areas of the layer are subject to partial exposure and solvent development, and yet require sufficient tack to be toned by particulate metal, e.g., copper powder. If low molecular weight monomeric compounds are used alone, they leach out during the development of the vias and the surface becomes nontonable. Highly viscous "glass-like" monomers, e.g., modified epoxy diacrylate resins, when present in conjunction with other monomers provide compositions less susceptible to leaching and which melt upon heating providing a suitable tacky surface for toning. The presence of elastomeric rubbers in the photoadherent layer provides thicker metal powder uptake and consistent via sidewall tonability. Cheaper fillers can be used satisfactorily, e.g., clay filler. MBS polymer having a 50% unsaturation can be present in the photoadherent composition, and the amount of slightly soluble elastomer indicated above can be minimized to what is required for toning and flexibility properties. To decrease brittleness the combination of the higher unsaturated MBS polymer, difunctional monomer in high concentration, and the presence of the elastomer, are effective. The layer or layers containing the above components are more flexible and possess good thermal and mechanical properties.

The lamination procedure, referred to above, can be a suitable method known in the art, e.g., one described in Celeste U.S. Pat. No. 3,469,982, Collier and Pilette U.S. Pat. No. 3,984,244 and Friel U.S. Pat. No. 4,127,436. These patents are incorporated by reference.

Once a photoadherable composition or layer(s) is applied to the circuit board surface, it is exposed imagewise to a source of actinic radiation through a circuit image consisting essentially of areas of three different optical densities as defined above. This circuit image is a major change over previous circuit images used in processes for making two or more layer printed circuit boards. Using conventional silver halide technology as described more fully below, the artwork information can be photocomposed into a composite of two registered phototools or preferably into a single phototool having three different optical densities as follows:

(1) Optical density about 0.0 (zero density) wherein substantially all light transmits and the photoadherent film is photohardened sufficiently to withstand any development or application of metal, etc. This optical density correlates to the normal background areas of a circuit.

(2) Optical density in the range of about at least 2.5, e.g., 2.5 to 4.5 and more (opaque density), wherein substantially no light is transmitted and the photoadherent layer(s) is fully solvent developable. This optical density represents vias or windows for interconnecting circuit layers.

(3) Optical density intermediate between that of (1) and (2) (gray density) wherein partial light is transmitted to the photoadherent layer or layers such that the layer(s) is undevelopable but retains good adherability of metal particles, etc. This gray density generally ranges from about 0.3 to about 2.5, but preferably will be at least one density unit less than the opaque density (2). Preferably the gray density is in the range of about 0.6 to 1.26. This optical density represents all the surface elements of a circuit, e.g., lines, pads, ground planes, etc.

The three different density circuit image is typically prepared as follows:

(1) Using standard commercial positive masks, a complete set of negatives using conventional graphic arts high contrast contact films and techniques is followed.

(2) The negatives prepared in (1) above are used as targets to prepare the three density circuit image.

(a) The negative image containing the lines, pad and other surface features is registered to a low gradient film, e.g., Cronar ® Continuous Tone Scanning Film (CCSF-7; type 774) manufactured by E. I. du Pont de Nemours and Company, Wilmington, DE. After registration, the exposure is adjusted to give the desired image gray density.

(b) After removal of the negative used in (a) the complementary negative containing the via and throughhole information is placed in proper registration over the low gradient film obtained in (a) above. The exposure is adjusted to give the film maximum opaque density after development. After the exposure, the film is developed in a processor containing standard low gradient film chemistry known to those skilled in the art. The developed film contains the three distinct regions of optical density set forth above.

Another but less preferred method of making a three density target is to prepare a composite target using the following steps:

(a) prepare the negative of the surface pattern features as described above;

(b) prepare a two density target, i.e., zero background and best gray density, e.g., 1.10, from the negative surface artwork. Use Cronar ® Continuous Tone Scanning Film as described above for the preparation of this target;

(c) place in registration the original positive phototool containing via image information over the film prepared in (b) above and join them together.

The resulting target is two pieces of film, in registration, which have three densities: zero for background; >2.5 for vias, and 1.10 for surface features.

The source providing actinic radiation for imagewise exposure are known to those skilled in the art and are rich in ultraviolet radiation. Suitable sources are disclosed in Plambeck U.S. Pat. No. 2,760,863. Chu and Cohen U.S. Pat. No. 3,649,268, Peiffer U.S. Pat. No. 4,157,407 and Haney and Lott U.S. Pat. No. 4,411,980, the disclosures of which are incorporated by reference. The exposure is through the phototool having the three different density circuit image described above.

Subsequent to the imagewise exposure the areas corresponding to image areas (2) in the phototool are removed with a suitable solvent for the particular photoadhesive composition used. The image areas corresponding to (1) and (3) of the phototool are not removed by the solvent. Suitable solvents include, e.g., 1,1,1-trichloroethane, perchloroethylene, perchloroethylene and n-butanol, 1,1,1-trichloroethane and n-butanol (preferred), butyl and ethyl Cellosolve ®, butyl Carbitol ® and 1,1,1-trichloroethane and derivatives thereof, various alcohols, e.g., methanol, ethanol, propanol, isopropanol, etc. and 1,1,1-trichloroethane, etc. These and other useful solvents are described in the patents which disclose the particular photoadhesive compositions.

Metal and alloy particles and plating catalyst particles are applied to the tacky and nontacky image areas. Suitable particles that can be subsequently electrolessly plated, or soldered as known in the art include: copper, tin, lead, solder, mixtures of copper and solder, copper-tin alloy, tin-lead alloy, aluminum, gold, silver; metal oxides such as titanous oxide, copper oxide, etc. Also useful are metal coated particles, e.g., silver coated glass. The particles have an average diameter of 0.5 to 250 μm, preferably 1.0 to 25 μm, in average diameter. Copper powder is preferred.

The particles can be applied by known methods including, but not limited to, the toning methods described in Burg and Cohen U.S. Pat. No. 3,060,024, Chu and Cohen U.S. Pat. No. 3,649,268 and Tobias U.S. Pat. No. 4,069,791. It is also possible to apply the particles by use of a fluidized bed of particles as described in Research Disclosure, June 1977. No. 15882 by Peiffer and Woodruff. The adherence of the particles to the image surface may be improved by tackifying the image areas, e.g., by heat from an infrared heater. This may be accomplished prior to or during the application of the particles, care must be exercised that only image areas corresponding to (3) of the phototool are tackified. If necessary, any excess metal, alloy or plating catalyst particles are removed from the nonadherent image areas. Suitable mechanical and other means for accomplishing this are described in the above-identified U.S. patents and the Research Disclosure, the disclosures of which are incorporated by reference.

Another optional step but one which is preferably used is the curing of the circuit board by heating, e.g., at a temperature up to 260° C. for at least 10 seconds and/or exposing the circuit board to overall ultraviolet radiation, e.g., from a radiation source as described above in the range of 0.1 to 10 minutes. The curing step, when used, can occur simultaneously with the application of the metal, alloy or plating catalyst particles and/or subsequent thereto. It is important that the duration and/or temperature used in the curing step be limited to prevent any substantial degradation of the photohardened element.

Electroless plating procedures are known to those skilled in the art, e.g., U.S. Pat. No. 4,054,483 which is incorporated by reference. Electroless plating baths are commercially available, e.g., from the Shipley Company, Revere, MA, Kollmorgen Corp., Glen Cove, N.Y., and other sources. Such baths may have to be modified to insure that the metal-bearing circuit board is maintained in the bath for a sufficient period of time, e.g., 1 to 6 hours, preferably 1 to 4 hours. Useful electroless plating solutions are described in the examples below, Zeblisky et al., U.S. Pat. No. 3,095,309, particularly Example II, which is incorporated by reference. The temperature of the electroless plating bath can range from 43° to 85° C., preferably 53° C.

A preferred embodiment of the invention is illustrated in Example 1 below.

INDUSTRIAL APPLICABILITY

The process of the invention enables two or more layered printed circuits with electrical interconnections to be prepared without drilling or punching the requisite hole and without chemical catalyzation of the through-holes which is time consuming. The process is simpler than those of the prior art and eliminates the necessity of any repetitive step in the making of a single conductive layer. The process therefore is easier to automate. The reduction in the number of process steps increases the yield of printed circuits produced thereby with an accompanying decrease in manufacturing cost. The artwork is preregistered since the components of the circuit are present on one phototool or image bearing transparency.

EXAMPLES

The following examples illustrate the invention wherein the parts and percentages are by weight.

EXAMPLE 1

This example illustrates the preparation of a two layer printed circuit utilizing an element having two photoadhesive layers.

A double-sided copper printed circuit laminate (1 in FIG. 1A (1 ounce (2.8 g) copper on each side) referred to in the trade as a ground plane is cut to the size 6 inch×6 inch (15.2 cm×15.2 cm) and the copper surfaces on both sides are mechanically scrubbed with a Somaca ®LD printed circuit brush (trademark 3M Co., St. Paul, MN). The scrubbed circuit board is immersed in a solution prepared as follows:
(a) to 2500 g distilled water,
(b) add concentrated hydrochloric acid, 380 g,
(c) add benzotriazole, 376.6 g, and
(d) bring total to 3800 g with distilled water, and then
(e) dilute 1 part to 9 parts of distilled water.

The treated circuit board is placed in a rinse water tank for 3 minutes followed by rinsing the board for about 30 seconds with distilled water. After the board is allowed to dry it is baked in an oven for about 15 minutes at 150° C. A polyethylene terephthalate film treated on one side with 16,250 release by Custom Coating and Laminating Corp., Worchester, MA, bearing a photosensitive layer (4 in FIG. 1A), about 0.00185 inch (0.047 mm) in thickness of the below-listed composition is laminated to the baked circuit board (1 in FIG. 1A) at 2 feet/minute (0.61 m/minute) at about 103° C. in a Riston ®HRL-24 Laminator manufactured by E. I. du Pont de Nemours and Company, Wilmington, DE.

| Ingredient | Amount (%) |
| --- | --- |
| Methylmethacrylate/butadiene/styrene terpolymer[1] | 10.20 |
| Rubber [3% carboxy-modified acrylonitrile(27)/butadiene(73)], high molecular weight, average Mooney viscosity is 45 | 10.60 |
| Di-(3-acryloxy-2-hydroxypropyl)-ether of bisphenol-A | 42.30 |
| Trimethylolpropanetriacrylate | 2.20 |
| Methyl methacrylate resin[2] | 4.30 |
| Michler's ketone | 0.03 |
| 4,4'-Dichlorobenzophenone | 3.97 |
| Harwick #71 Clay[3] | 26.40 |

[1]white free flowing powder having a maximum of 0.3% volatiles; particle size distribution of maximum 10% on 45 mesh screen, maximum 10% through 325 mesh screen; specific gravity 1.0, sold under the trademark Acryloid ® KM-BTA-III-F
[2]polymer medium molecular weight range, inherent viscosity of 0.45 when 0.25 g polymer is dissolved in 50 ml chloroform, measured at 25° C. using a No. 50 Cannon-Fenske viscometer, specific gravity (25°/25° C.) of 1.15, glass transition temp. (°C.) is 87, Tukon hardness (Knoop No.) is 17, acid No. is 0, sold under the trademark Elvacite ® 2009 Methyl Methacrylate Resins, E. I. du Pont de Nemours and Company, Wilmington, DE.
[3]high brightness clay having a chemical compositions: $SiO_2$ (45.5%), $Al_2O_3$ (38.3%), $Fe_2O_3$ (0.3%), $TiO_2$ (1.5%), CaO (0.1%) $Na_2O$ (0.1%), $K_2O$ (trace), specific gravity of 2.58, average particle size 0.55 μm, oil absorption (ASTM D281-31) of 37 to 41, refractive index 1.56, pH 6.5 to 7.5 sold by Harwick Chemical Corp., Akron, Ohio.

The film is removed from the photosensitive layer and a second, polyethylene terephthalate film 0.00092 inch (0.23 mm) thick supported (2 in FIG. 1A) photosensitive layer (3 in FIG. 1A), about 0.150 inch (3.81 mm) in thickness of the below-listed composition is laminated to the first laminated layer at the same conditions described above.

| Ingredient | Amount (%) |
| --- | --- |
| Methyl methacrylate resin[1] | 31.9 |
| Di-(3-acryloxy-2-hydroxypropyl)-ether of bisphenol-A | 51.6 |
| Trimethylolpropanetriacrylate | 10.0 |
| 2-(stilbyl-4")-(naptho-1,2":4,5)-1,2,3-triazol-2"-sulfonic acid phenyl ester | 2.2 |
| 2-Mercaptobenzoxazole | 1.5 |
| 4,4'-Dichlorobenzophenone | 2.0 |
| Michler's ketone | 0.1 |
| Polyethylene oxide[2] | 0.7 |

[1]polymer high molecular weight range, inherent viscosity 1.20 when 0.25 g polymer is dissolved in 50 ml chloroform, measured at 25° C. using a No. 50 Cannon-Fenske viscometer; glass transition temperature (°C.) of 95, Tukon hardness, Knoop No. 19, typical viscosity in toluene, mPa.s (cP), at 25° C. (% solids) is 1,400 (17.5%).
[2]water soluble resin having a weight average molecular weight of about 400,000 and a viscosity range at 25° C. of 2,250-3350 (5% solution) using a Brookfield viscometer Spindle No. 1 at 2 rpm commercially available as Polyox @ WSRN 3000, Union Carbide Corp., New York, New York.

Figure 1B:
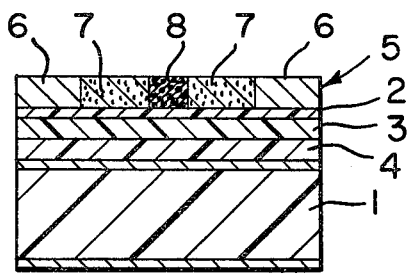

The three-density target (5 in FIG. 1B) having optical density areas of about 0.0 (6 in FIG. 1B), greater than 3.0 (8 in FIG. 1B) and about 1.0 (7 in FIG. 1B) described above is placed in register over the film protecting the upper photosensitive layer and is exposed for about 65 seconds using a Tamorack ®152R Exposure Unit, a 1000 watt collimated mercury arc source.

Figure 1C:
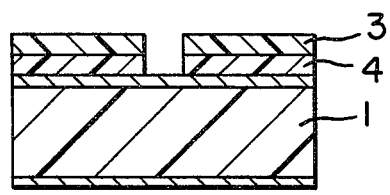
Figure 1D:
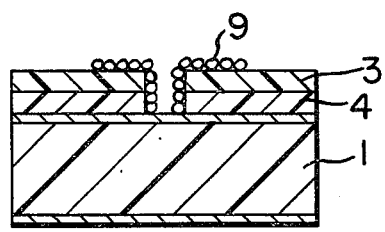
Figure 1E:
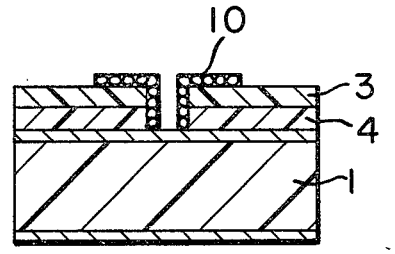

The protective film (2 in FIG. 1A) is removed and the exposed laminate is developed in a spray processor, having nozzles No. H1/8 U8010 Vee Jet, Spray System Co., Wheaton, Ill., spaced 1 inch (2.54 cm) apart and placed 4 inches (10.16 cm) from the laminate surface. The solvent developer is methyl chloroform (50%)/n-butanol (50%) and is applied at 72° F. (22.2° C.) for about 30 seconds at a spray pressure of 50 to 80 psi. The developed laminate (FIG. 1C) is rinsed with water and the droplets of water remaining are removed with forced air or a towel. The developed laminate is placed in a forced air hood for 3 hours or placed in an oven at 75° C. for about 1 hour to dry. The dry laminate is then heated to about 150°–160° C. in an oven or using infrared equipment. The hot surface is then toned (FIG. 1D) with Cerac ® copper powder (Lot No. 4251) (spherical particles having median size of about 2.85 μm made from atomized melt) (9 in FIG. 1D) with an automatic toning machine as described in Tobias U.S. Pat. No. 4,069,791 or manually with a pad having the copper powder on its surface. The toned element is allowed to cool to room temperature, and the toned polymer surface is washed with water and the background areas are cleaned with water-soaked towel to remove toner in background areas. The toned element is air dried and is cured by heating with an infrared radiation source so that the temperature exceeds 260° C. for 0.5 minute (alternatively the element can be heated at 100° C. for 1 hour and then 150° C. for 1 hour). The infrared cured element is further cured with ultraviolet radiation using both lamps of an Argus International PC-7100 Ultraviolet Processor at 20 feet/minute (~6.1 m/minute) speed setting. The toned surface is degreased by washing with a warm soapy solution of pH about 9 followed by a warm water rinse and the toned element is allowed to cool. The toned element is immersed for 15 seconds into 1% sulfuric acid solution, followed by a rinse in a water tank and a distilled water tank each for 30 seconds. The rinsed toned element is placed immediately into a copper electroless plating bath purchased from Photocircuits Kollmorgen, Glen Cove, N.Y. designated PCK AP-480 (referred to as additive plating bath 480, electroless copper addition technology) and maintained in the plating bath for 2 hours. The electrolessly plated circuit (10 in FIG. 1E) is rinsed in water for 1 minute, immersed for 3 minutes in the benzotriazole solution described above, rinsed again in water and dried. After the circuit is baked for 1 hour at 150° C., it is cooled and tested. A two layer conductive circuit is obtained. The process is repeated for two subsequent circuit layers using the appropriate phototools.

EXAMPLE 2

This example illustrates the preparation of a two layer printed circuit utilizing an element having a single photoadhesive layer.

Example 1 is repeated except that in place of the two photosensitive layers laminated to the scrubbed and baked copper clad printed circuit board is laminated a single polyethylene terephthalate supported photosensitive layer 0.002 inch (0.051 mm) in thickness of the following composition:

| Ingredient | Amount (%) |
| --- | --- |
| Poly(methylmethacrylate/butadiene/styrene terpolymer described in Example 1 (first layer) | 13.1 |
| Methylmethacrylate (96%)/ethyl methacrylate (4%) copolymer[1] | 2.6 |
| Acrylated epoxy resin[2] | 43.9 |
| Trimethylolpropanetriacrylate | 3.4 |
| Michler's ketone | 0.2 |
| 4,4'-Dichlorobenzophenone | 3.9 |
| Green pigment[3] | 0.1 |
| Harwick ® 50R clay[4] | 26.2 |
| Acrylonitrile/butadiene rubber described in Example 1 (first layer) | 6.6 |

[1]inherent viscosity of 0.25 g polymer in 50 ml CH$_2$Cl$_2$ measured at 20° C. using a No. 50 Cannon-Fenske Viscometer is 0.5
[2]nonvolatile, high viscosity at 25° C./77° F. (~660,000 cps), flash point >200° F. sold under the trademark CMD 3702 UV/EB Curable Resin by Celanese Chemical Co., Dallas, Texas.
[3]Monastral Green ® (pigment 30%) rollmill blended with methylmethacrylate (34)/styrene(42)/-acrylonitrile(8)/butadiene(16) interpolymer.
[4]water washed clay, G.E. brightness of 86.5 to 88.0, average particle size is 0.55 μm, pH 3.8 to 5.0, oil absorption (ASTM D-281-31) is 37.6 to 41.0, specific gravity of 2.58 sold by Harwick Chemical Corp., Akron, Ohio.

The ingredients are added to methylene chloride (overall solids about 30%) and are ball milled with 0.125 inch (3.18 mm) stainless steel shot (one gram of shot for each gram of solution) for 72 hours on a roller mill. The composition is coated on 0.001 inch (0.025 mm) thick silicone treated polyethylene terephthalate film so that the solvent-free thickness is 0.002 inch (0.051 mm) and then is laminated with 0.001 inch (0.025 mm) thick polyethylene terephthalate film having a releasable layer of polydimethyl siloxane coated thereon to give a coating weight of about 125 mg/dm$^2$ when dried.

The single photoadherent layer is very tacky, has high flow rate, is developable in organic solvents, e.g., methyl chloroform, has a ultraviolet density of about 2.0 at 360 nm, tones readily with the copper powder and is cured to a flexible state. A two layer conductive circuit is obtained.

EXAMPLE 3

A baked copper clad printed circuit board is prepared as described in Example 1. To the heated surface is laminated a 0.001 inch (0.025 mm) thick polyethylene terephthalate supported photosensitive layer of the following composition as described in Example 1.

| Ingredient | Amount (%) |
| --- | --- |
| Poly(methylmethacrylate (34)/acrylonitrile (8)/butadiene (16)/ styrene (42 interpolymer | 14.59 |
| Methylmethacrylate (96)/ethylmethacrylate (4%) copolymer described in Example 2 | 5.98 |
| Acrylonitrile/butadiene rubber described in Example 1 (first layer) | 12.72 |
| Pentaerythritol triacrylate | 19.29 |
| Di-(3-acryloxy-2-hydroxypropyl) ether of bisphenol-A | 19.29 |
| 4,4'-Dichlorobenzophenone | 4.64 |
| Michler's ketone | 0.32 |
| Green pigment described in Example 2 | 0.09 |
| Polyethylene covered talc, 5 μm | 23.08 |

Over the supported laminated photosensitive layer is place a via target (dots at density of >3.0 and preferably 4.5) and a continuous tone step wedge having 0.29, 0.92, and 1.77 density areas is superimposed over the via target and joined together. The photosensitive layer is exposed to a Riston®PC-24 light source manufactured by E. I. du Pont de Nemours and Company having a power of 5 kw and at a 20 unit setting. After removal of the support, the exposed printed circuit board is developed with methyl chloroform (1,1,1-trichloroethane) in a Riston®"C" Processor for 60 seconds at a temperature of about 70° F. (21° C.). The developed circuit board is dried and then toned with copper powder toner having a median size of about 1.6 μm (Du Pont P-1120 copper powder toner). The copper powder adhered in the developed vias areas and in the areas in the region of optical density 0.92 which are nondevelopable. The areas in the region of optical density 0.29 are nondevelopable and nontonable. The areas in the region of optical density 1.77 are developed and there are no areas left that are tonable. The toned circuit board is cured with ultraviolet radiation using both lamps of an Argus International PC-7100 Ultraviolet Processor at 10 feet/minute followed by heating for 2 hours at 150° C. The cured toned circuit board is preplate cleaned (degreased, immersed in sulfuric acid, rinsed in water) as described in Example 1 and copper electroless plated also as described in Example 1. After rinsing in hot water and drying the circuit is tested. A conductive circuit is obtained.

I claim:

1. A process for preparing a two layer printed circuit board having conductive interconnections which comprises:
   (a) applying to a substrate bearing an electrically conductive circuit or circuit pattern at least one layer of a photoadhesive composition;
   (b) exposing the layer or layers to actinic radiation through a circuit image consisting essentially of areas of three different optical densities (1) optical density about 0.0 which transmits substantially all the actinic radiation; (2) optical density at least about 2.5 which transmits substantially no actinic radiation; and (3) optical density intermediate between values of (1) and (2) which transmits partial actinic radiation:
   (c) removing the areas corresponding to image areas (2) in step (b) with a solvent for the photoadhesive composition to form vias with sidewalls, image areas (1) and (3) of step (b) being nonremovable with said solvent;
   (d) optionally tackifying image areas corresponding to (3) of step (b);
   (e) applying finely divided metal, alloy or plating catalyst to adherent image areas corresponding to (3) in step (b) and sidwalls formed in step (c);
   (f) optionally removing excess toner from image areas corresponding to (1) of step (b);
   (g) optionally curing the circuit board by heating the board at a temperature up to at least 100° C.; and/or exposing the circuit board to ultraviolet radiation; and
   (h) plating the metallized or catalyzed image to form an electrically conductive circuit pattern interconnected with the underlying circuit pattern or circuit.

2. A process according to claim 1 wherein the optical density of area (3) of the circuit image is about 0.6 to about 1.26.

3. A process according to claim 1 wherein tackifying image areas as in step (d) is accomplished by heating prior to and/or during step (e).

4. A process according to claim 1 wherein the finely divided metal is a metal powder, 1.0 to 250 μm in average diameter.

5. A process according to claim 4 wherein the metal powder is copper or a copper alloy.

6. A process according to claim 1 wherein the photoadhesive composition is applied in the form of a two layer dry film.

7. A process according to claim 1 wherein the layer of photoadhesive composition is applied in the form of a dry film.

8. A process according to claim 1 wherein after step (e) and step (f), if utilized, the circuit board is cured by heating the board at a temperature up to at least 260° C.

9. A process according to claim 1 wherein after step (e) and step (f), if utilized, the circuit board is exposed to ultraviolet radiation.

10. A process according to claim 1 wherein concurrently with step (e) the circuit board is cured by heating the board at a temperature up to at least 260° C.

11. A process for preparing a multilayer printed circuit board having conductive interconnections which comprises preparing a two layer printed circuit according to claim 1 and then repeating steps (a) to (h) at least once using the newly plated circuit pattern in step (h) for the succeeding process step (a).

* * * * *